United States Patent [19]

Lopez et al.

[11] Patent Number: 4,949,341
[45] Date of Patent: Aug. 14, 1990

[54] BUILT-IN SELF TEST METHOD FOR APPLICATION SPECIFIC INTEGRATED CIRCUIT LIBRARIES

[75] Inventors: David E. Lopez; Tomas Colunga, both of Tempa, Ariz.

[73] Assignee: Motorola Inc., Schaumburg, Ill.

[21] Appl. No.: 263,855

[22] Filed: Oct. 28, 1988

[51] Int. Cl.$^5$ .................................................. G06F 11/00
[52] U.S. Cl. ..................................... 371/25.1; 371/22.6
[58] Field of Search ..................... 371/25.1, 22.6, 21.1, 371/22.1, 22.4, 15.1

[56] References Cited

U.S. PATENT DOCUMENTS

| Re. 31,828 | 2/1985 | Raymond | 371/22.6 |
|---|---|---|---|
| 3,919,504 | 11/1975 | Crosley | 371/22.6 |
| 3,919,637 | 11/1975 | Earp | 371/22.1 |
| 4,216,539 | 8/1980 | Raymond | 371/22.6 |
| 4,339,819 | 7/1982 | Jacobson | 371/22.6 |
| 4,358,847 | 11/1982 | Susskind | 371/25.1 |
| 4,471,483 | 9/1984 | Chamberlain | 371/21.1 |
| 4,500,993 | 2/1985 | Jacobson | 371/22.6 |

Primary Examiner—Michael R. Fleming
Attorney, Agent, or Firm—Michael D. Bingham

[57] ABSTRACT

A design and method of exhaustively verifying the boolean functionality of both combinational and sequential cells for Application Specific Integrted Circuit gate array and standard cell libraries is provided. A single integrated circuit includes a plurality of cells or macros from the library. A Gray code generator provides a plurality of Gray code signals to the cells in response to a binary counter. The binary and Gray code signals stimulate each state of each cell. A multiplexed output indicates the functionality of each state.

21 Claims, 3 Drawing Sheets

| VECTOR | B3 | B2 | B1 | B0 | G3 | G2 | G1 | G0 |
|---|---|---|---|---|---|---|---|---|
| 0 | 0 | 0 | 0 | 0 | 0 | 0 | 0 | 0 |
| 1 | 0 | 0 | 0 | 1 | 0 | 0 | 0 | 1 |
| 2 | 0 | 0 | 1 | 0 | 0 | 0 | 1 | 1 |
| 3 | 0 | 0 | 1 | 1 | 0 | 0 | 1 | 0 |
| 4 | 0 | 1 | 0 | 0 | 0 | 1 | 1 | 0 |
| 5 | 0 | 1 | 0 | 1 | 0 | 1 | 1 | 1 |
| 6 | 0 | 1 | 1 | 0 | 0 | 1 | 0 | 1 |
| 7 | 0 | 1 | 1 | 1 | 0 | 1 | 0 | 0 |
| 8 | 1 | 0 | 0 | 0 | 1 | 1 | 0 | 0 |
| 9 | 1 | 0 | 0 | 1 | 1 | 1 | 0 | 1 |
| 10 | 1 | 0 | 1 | 0 | 1 | 1 | 1 | 1 |
| 11 | 1 | 0 | 1 | 1 | 1 | 1 | 1 | 0 |
| 12 | 1 | 1 | 0 | 0 | 1 | 0 | 1 | 0 |
| 13 | 1 | 1 | 0 | 1 | 1 | 0 | 1 | 1 |
| 14 | 1 | 1 | 1 | 0 | 1 | 0 | 0 | 1 |
| 15 | 1 | 1 | 1 | 1 | 1 | 0 | 0 | 0 |

*FIG. 2*

BUILT-IN SELF TEST METHOD FOR APPLICATION SPECIFIC INTEGRATED CIRCUIT LIBRARIES

FIELD OF THE INVENTION

This invention relates in general to a design and method of exhaustively verifying the boolean functionality of both combinational and sequential cells for Application Specific Integrated Circuit gate array and standard cell libraries.

BACKGROUND OF THE INVENTION

Application Specific Integrated Circuits (ASIC) typically include gate arrays and standard cells (CMOS, bipolar and BIMOS technology). Gate arrays are mainly pre-processed wafers with macrocells which are similar to familiar standard logic functions. A designer calls up these macrocells from a softward library on a Computer Aided Design (CAD) system and places them in the desired location with appropriate interconnections. Gate arrays provide increased silicon efficiency and consequently higher logic densities and lower cost than previously used large scale integrated (LSI) circuit design methodologies.

Standard Cells comprise a library of functions ranging from primitive functions such as AND and OR gates to more comples functions such as random access memory (RAM). The designer designs the chip by placing and interconnecting the pre-defined library of functions.

The task of verifying the boolean functionality of gate array and standard cell libraries, both from a CAD and a silicon point of view, has been difficult with previously known methodologies. The logic designer is concerned whether his design configurations are fully functional on silicon. The layout, or CAD, designer is concerned whether his library models and associated tools function correctly and thus produce functional silicon.

Three previously known methods exist for verifying functionality of gate array and standard cell libraries. A first approach ties the inputs of the macros directly to package pins (may be buffered if required by the technology). Although this is a simple design and direct access of all ports is obtained, the design is input/output intensive, requires manual test pattern development and manual verification of output response.

A second approach multiplexes the output of the macros to reduce the number of required output pins. Additional control pins are added to direct the multiplexer.

A third approach includes a binary counter for creating vectors as inputs to the macros of the library and multiplexing the outputs of the macros. This is the best of the three previously known approaches since exhaustive macro functional verification can be achieved. The limitation of this approach, as with the first two, is that the problem of stimulating sequential macros is not accomplished. These approaches do not exhaustively test sequential macros and require extra special care since timing is critical. Additionally, the task of output response verification is not satisfied.

With gate arrays and standard cell configurations growing in size and complexity, the need for tools and design configurations for verifying these environments, in a timely fashion, are of utmost importance.

Thus, what is needed is a design and method of exhaustively verifying the boolean functionality of both combinational and sequential cells of Application Specific Integrated Circuit gate array and standard cell libraries.

SUMMARY OF THE INVENTION

Accordingly, it is an object of the present invention to provide an improved method of exhaustively verifying the boolean functionality of gate array and standard cell libraries.

In carrying out the above and other objects of the invention in one form, there is provided an integrated circuit including circuitry for verifying the boolean functionality of a plurality of cells on the integrated circuit comprising a Gray code counter coupled between a binary counter and the cells, wherein logic states of the cells are stimulated by the binary and Gray code signals.

The above and other objects, features, and advantages of the present invention will be better understood from the following detailed description taken in conjunction with the accompanying drawings.

BRIEF DESCRIPTION OF THE DRAWING

FIG. 2 is a table of binary signals and equivalent Gray code signals.

DETAILED DESCRIPTION OF THE INVENTION

Figure 1A:
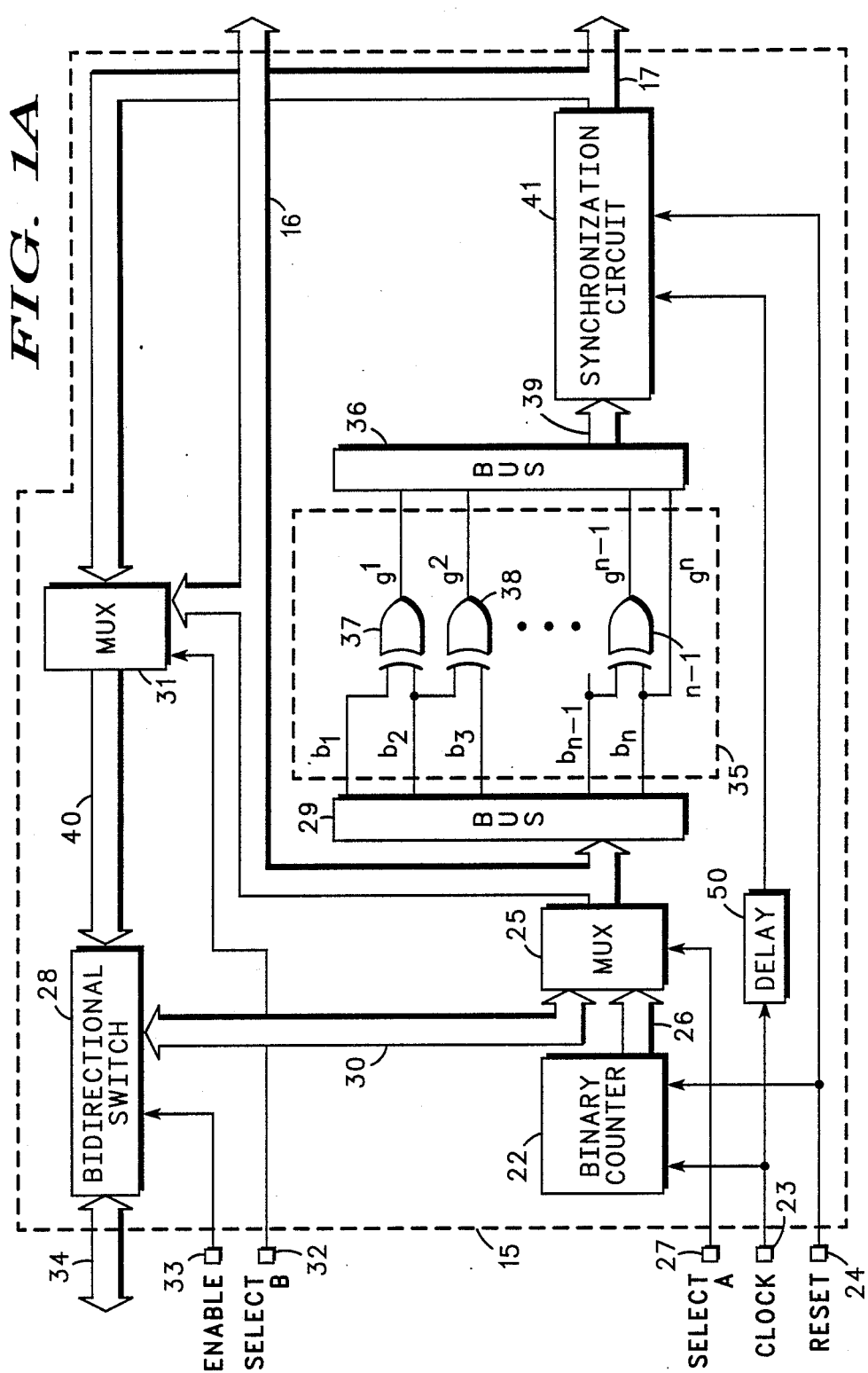
FIG. 1 (A and B) is a block diagram of the present invention.
Figure 1B:
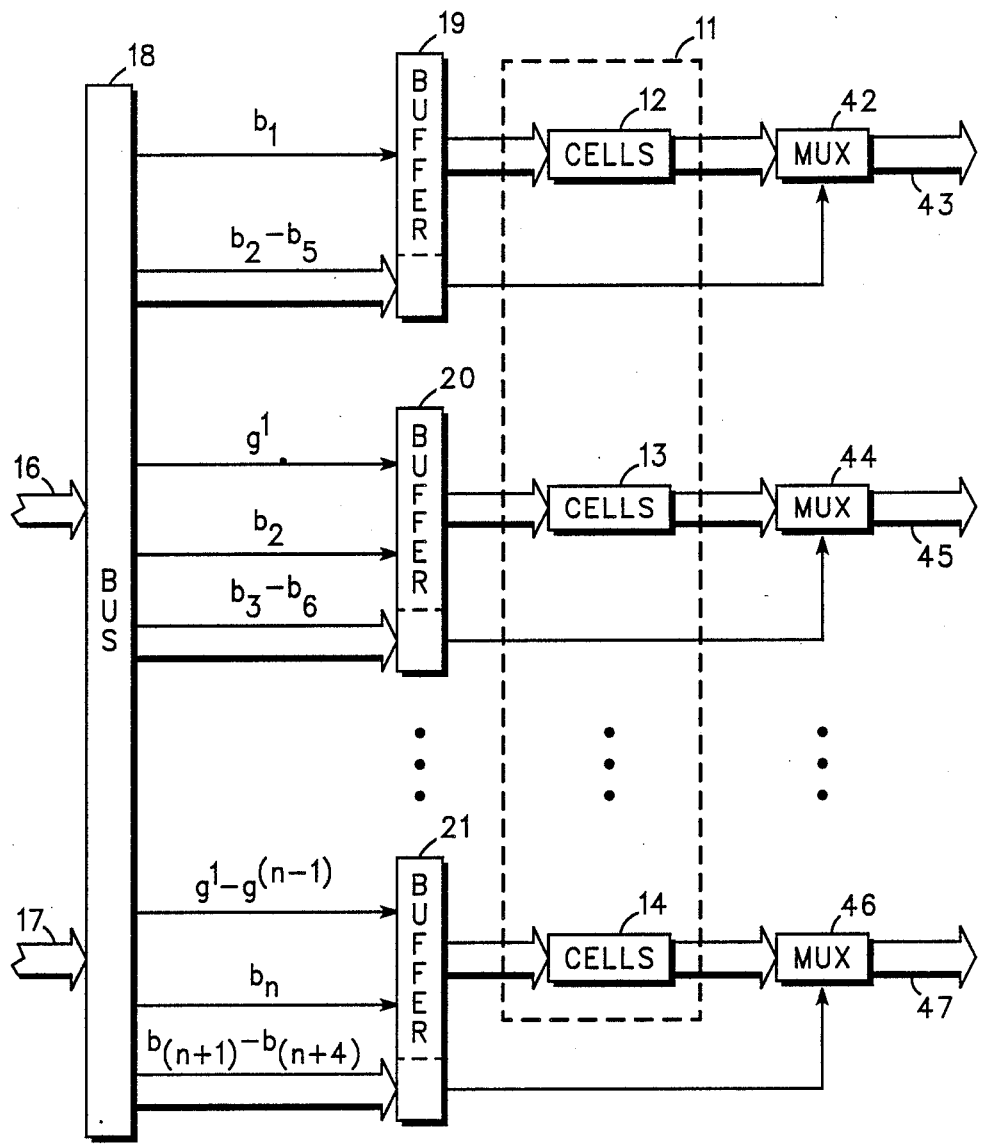

Referring to FIG. 1, a block diagram of an integrated circuit is shown and includes a plurality of cells 11 comprising an Application Specific Integrated Circuit library. Each cell 11 may be, for example, a gate array macro or a standard cell. All cells 11 of the Application Specific Integrated Circuit library for which functionality testing is desired, along with the additional circuitry of FIG. 1 would be manufactured in silicon on a single chip or chips. Testing could be performed on the chip by the manufacturer to verify its library, or by the customer to verify the cells 11 included in its customized array.

In the preferred embodiment, each cell 11 is defined by the number of input pins for that particular cell 11. Cells 12, 13 and 14 comprise those cells 11 with a single input pin, two input pins and n input pins, respectively. The cells 11 are divided in this manner for convenience for debugging purposes. The number of cells 11 in a library may number several hundred cells. Dividing the cells 11 thus greatly simiplifies the task.

A vector generator 15 supplies a plurality of binary signals 16 and a plurality of Gray code signals 17 to cells 11 by way of bus 18 and buffers 19, 20 and 21 for testing the functionality of cells 11. A binary counter 22 is coupled to a clock input pad 23 and a reset pad 24 for receiving a CLOCK and RESET signal, respectively, and is connected to multiplexer 25 for providing a plurality of binary signals 26 thereto. The synchronous binary counter 22 increments in a binary fashion on the positive edge of the clock and maximizes the frequency of the clock cycle. The multiplexer 25 is connected to a select pad 27 and to the bidirectional switch 28 for receiving a SELECT A signal and a test signal 30, respectively, and provides the binary signals 16 to a bus 18, a bus 29 and a multiplexer 31. The multiplexer 31 is coupled to a select pad 32 for receiving a SELECT B signal and provides a signal 40 to a bidirectional switch 28. The bidirectional switch 28 provides monitor signals 34 as an output in response to an ENABLE signal from an enable pad 33. Therefore, binary signals 16 and Gray code signals 17 are multiplexed and provided as monitor signals 34 for debug purposes. The SELECT B signal on the pad 32 controls which signal 16 or 17 is routed to monitor signals 34, and the ENABLE signal on pad 33 controls the tristate operation of the bus. When disabled, the bidirectional switch 28 provides for a specific monitor signal 34 as an input from outside the circuit to bidirectional 28 to be transfered as test signal 30 for duplicating a specific fault discovered during the testing sequence.

The gray code counter 35 is coupled between the bus 29 and the bus 36 and comprises a plurality of exclusive OR gates 37, 38 through (n−1). The inputs of exclusive OR gate 37 are coupled to receive binary signals $b_1$ and $b_2$; the inputs of exclusive OR gate 38 are coupled to receive binary signals $b_2$ and $b_3$; and so forth, with the inputs of exclusive OR gate (n−1) coupled to receive binary signals $b_n-1$ and $b_n$. The exclusive OR gates 37, 38 through (n−1) provide Gray code signals $g^1, g^2$ and $g^{n-1}$, respectively. The Gray code signal $g^n$ is the same as binary signal $b_n$.

Referring to FIG. 2, a table illustrates sixteen vectors, showing the binary signal 16 for each vector (the input to Gray code counter 35), and the equivalent Gray code signal 39 for each vector (the output of Gray code counter 35). Only sixteen vectors and only four binary and Gray code signals are shown as an example. The number of vectors and binary and Gray code signals could vary considerably depending on the number of cell classes 12, 13 and 14 to be verified. Vector 1 shows both the binary and Gray code signal comprising zeros. Vector 2 has the binary signal going to 0001 and the Gray code signal going to 0001. When the binary signal goes to 0010 for vector 3, the Gray code signal goes to 0011. Note for vector 3 that the first and second digits of the binary signal changed state, while only the second digit for the Cray code changed state. This unique property of the Gray code, in which only one transition occurs per vector, solves the problem of pads changing simultaneously and causing havoc in a timing sensitive sequential cell.

The synchronization circuit 41 synchronizes the Gray code signals 39 in response to the CLOCK signal and the RESET signal on the pads 23 and 24, respectively, insuring that the transition dictated by the Gray code circuit 35 is timed with respect to the negative edge of the CLOCK signal. Delay circuit 50 insures that synchronization circuit 41 has received the appropriate signals 39 before being clocked.

Buffers 19, 20 and 21 provide acceptable voltage and current stimulus for each binary and Gray code signals 16 and 17, respectively. The single input pin cells 12 receive binary signal $b_1$, and provides an output to multiplexer 42. The multiplexer 42 then provides an output 43 in response to binary signals $b_2$ through $b_5$. Likewise, two input pin cells 13 receive Gray code signal $g^1$ and binary signal $b_2$, and provides an output to multiplexer 44. The multiplexer 44 then provides an output 45 in response to binary signals $b_3$ through $b_6$. Signals $b_2-b_5$, $b_3-b_6$ and $b_{9n+1}-b_{(n+4)}$ each comprise four signals which controls a sixteen to one multiplexer 42, 44 and 46, respectively. Larger or smaller multiplexers may be used. Therefore, each cell output in classes 12, 13 and 14 is multiplexed to the output 43, 45 and 47, respectively for all combinations of input stimulus 18 for that cell before the multiplexor changes to the next cell output in the select sequence. This provides for an orderly sequence of interrogating each cell output for all combinations of cell input stimulus.

A truth table for a sequential logic cell contains all of the states wherein different input combinations cause a change in the cell output. The truth table may contain only some of the input no-change states.

A software model for each sequential cell is generated which is used to empirically derive how to correctly stimulate the cells. A means of empirically verifying correct stimulus for sequencial cells comprises an input file including a vector listing of the Gray code and binary counter bits, and a program file including the description for all of the sequential cells in the library along with additional code for generating an appropriate output file.

By using this software model approach, the user need not be concerned about the specific functionality of the cell itself. A variable input is introduced which is simply a numeric entry for each of the cell truth table entries. The cell functionality is verified by creating a software model which is simply an image of the cell truth table. The input file is obtained by simulating the vector generator 15 and obtaining the binary and Gray code signals 16 and 17 as an output file. This simulation output file will then be used as the input file for the cell software model program.

Many executions of the program can be made in a very short period of time by simply changing the model name to bit assignment. Listing first those states which are not dependent on previous vector data will ensure that flip flop states are not masked. One method that has worked quite well is in determining the cell node to bit assignment for flip flops is to assign the Gray code least significant bit(s) to the CLOCK signal followed by the SELECT signal inputs followed by the RESET signal. Skipping bits is sometimes necessary to obtain maximum advantage of the lower order bits. Furthermore, it is helpful, and simiplifies matters to make the most significant bit use a binary counter bit. Utilizing a binary bit as the MSB makes it possible to obtain all of the binary counts in Gray code.

The output verification portion of this method comprises a design simulation output file, and emulator and comparator program. The input file for the program is the simulation output file obtained from a workstation or main frame. This file is composed of the binary and Gray code outputs along with every output 43, 45 and 47 for the entire vector set. The binary and Gray code outputs are used to drive the emulator portion of the program and every output needs to be part of this file in order to be verified.

The software program contains the necessary code to emulate the cells, compare expected versus actual output response, and generate an output report file.

By now it should be appreciated that there has been provided a design and method of exhustively verifying the boolean functionality of both combinational and sequential cells for Application Specific Integrated Circuit gate array and standard cell libraries.

We claim:

1. A circuit for testing a plurality of logic states of each of a plurality of cells, said circuit comprising:
   first means for generating a plurality of binary signals;
   second means reponsive to said plurality of binary signals for converting said binary signals into Gray code signals, said binary and Gray code signals being sequentially applied to the plurality of cells of producing a plurality of input stimuli thereat to generate the plurality of logic states within the plurality of cells; and third means coupled to the plurality of cells for providing an output in response to each of the plurality of logic states, wherein said output can be utilized to generate a truth table to test the functionality of the plurality of cells.

2. The circuit according to claim 1 further comprising fourth means coupled to said first and second means for monitoring said binary and Gray code signals.

3. The circuit according to claim 2 further comprising fifth means coupled between said first and second means for providing a specific binary and Gray code signal for establishing a specific logic state for said cells plurality of.

4. The circuit according to claim 1 wherein said first means comprises:
a clock terminal;
a reset terminal; and
a binary counter coupled between said second means and both said clock and reset terminal.

5. The circuit according to claim 4 wherein said second means comprises:
a Gray code counter;
a synchronization circuit coupled between said Gray code counter and said plurality of cells and coupled to said reset terminal; and
a delay circuit coupled between said clock terminal and said synchronization circuit.

6. The circuit according to claim 5 wherein said fourth means comprises a first multiplexer coupled to said binary counter and said synchronization circuit for providing said binary and Gray code signals as an output.

7. The circuit according to claim 6 wherein said fifth means comprises a second multiplexer coupled to receive a specific combination of binary and Gray code signals and coupled to said Gray code counter.

8. The circuit according to claim 7 wherein said third means comprises at least one third multiplexer coupled to said plurality of cells for providing an output for each logic state of said plurality of cells.

9. The circuit according to claim 7 further comprising a bidirectional switch coupled to said first and second multiplexers for selectively providing the binary signals provided by said binary counter and Gray code signals provided by said Gray code counter as an output, and for receiving specific binary and Gray code signals as an input and providing said specific binary and Gray code signals to said second multiplexer.

10. An integrated circuit including circuitry for verifying the boolean functionality of a plurality of cells on said integrated circuit, said circuitry comprising:
first means for generating a plurality of binary signals;
second means responsive to said plurality of binary signals for converting said binary signals into Gray code signals, said binary and Gray code signals being sequentially applied to the plurality of cells for producing a plurality of input stimuli thereat to generate a plurality of logic states within the plurality of cells; and
third means coupled to the plurality of cells for providing an output in response to each said plurality of logic states, wherein said output can be utilized to generate a truth table to test the functionality of the plurality of cells.

11. The integrated circuit according to claim 10 further comprising fourth means coupled to said first and second means for monitoring said binary and Gray code signals.

12. The integrated circuit according to claim 11 further comprising fifth means coupled between said first and second means for providing a specific binary and Gray code signal for establishing a specific logic state for said cells plurality of.

13. The integrated circuit according to claim 10 wherein said first means comprises:
a clock pad;
a reset pad; and
a binary counter coupled between said second means and both said clock and reset pads.

14. The integrated circuit according to claim 13 wherein said second means comprises:
a Gray code counter;
a synchronization circuit coupled between said Gray code counter and said plurality of cells and coupled to said reset pad; and
a delay circuit coupled between said clock pad and said synchronization circuit.

15. The integrated circuit according to claim 14 wherein said fourth means comprises a first multiplexer coupled to said binary counter and said synchronization circuit for providing said binary and Gray code signals as an output.

16. The integrated circuit according to claim 15 wherein said fifth means comprises a second multiplexer coupled to receive a specific combination of binary and Gray code signals and coupled to said Gray code counter.

17. The circuit according to claim 16 wherein said third means comprises at least one third multiplexer coupled to said plurality of cells for providing an output for each logic state of said plurality of cells.

18. The integrated circuit according to claim 16 further comprising a bidirectional switch coupled to said first and second multiplexers for selectively providing the binary signals provided by said binary counter and Gray code signals provided by said Gray code counter as an output, and for receiving specific binary and Gray code signals as an input and providing said specific binary and Gray code signals to said second multiplexer.

19. A method of verifying the boolean functionality of a plurality of cells on an integrated circuit, said method comprising the steps of:
generating a plurality of binary signals;
generating a plurality of Gray code signals in response to the binary signals;
applying said binary and Gray code signals to the plurality of cells for producing a plurality of input stimuli thereat wherein a plurality of logic states within the plurality of cells are produced in response to said plurality of input stimuli; and
providing an output signal in response to each said plurality of logic states wherein said output signal can be utilized to generate a truth table to test the functionality of the plurality of cells.

20. The method according to claim 19 further comprising the step of monitoring the binary and Gray code signals.

21. The method according to claim 20 further comprising the step of inputing a specific combination of binary and Gray code signals for testing a specific logic state for the cells plurality of.

* * * * *

UNITED STATES PATENT AND TRADEMARK OFFICE
CERTIFICATE OF CORRECTION

PATENT NO. : 4,949,341

DATED : August 14, 1990

INVENTOR(S) : David E. Lopez, Tomas Colunga

It is certified that error appears in the above-identified patent and that said Letters Patent is hereby corrected as shown below:

In column 6, line 67, claim 21, delete "cells plurality of" and insert therefor --plurality of cells--.

Signed and Sealed this

Second Day of June, 1992

Attest:

DOUGLAS B. COMER

Attesting Officer

Acting Commissioner of Patents and Trademarks